United States Patent [19]

Muench et al.

[11] Patent Number: 4,647,141
[45] Date of Patent: Mar. 3, 1987

[54] ZENER BARRIER

[75] Inventors: Albert Muench, Eberbach; Gerhard Schwarz, Allemühl, both of Fed. Rep. of Germany

[73] Assignee: Brown, Boveri & Cie, AG., Mannheim, Fed. Rep. of Germany

[21] Appl. No.: 596,089

[22] Filed: Apr. 2, 1984

[30] Foreign Application Priority Data

Apr. 2, 1983 [DE] Fed. Rep. of Germany ....... 3312081

[51] Int. Cl.$^4$ ............................................. H01R 9/26
[52] U.S. Cl. ........................... 339/198 GA; 339/14 R; 339/17 R; 339/116 R
[58] Field of Search ....... 339/198 G, 198 GA, 198 H, 339/198 E, 198 J, 198 R, 116 R, 94 R, 122 R, 122 F, 218 M, 218 R, 218 C, 17 R, 17 C, 14 R, 150 B, 151 B

[56] References Cited

U.S. PATENT DOCUMENTS

| | | | |
|---|---|---|---|
| 3,579,046 | 5/1971 | Jordan | 339/17 R |
| 4,072,378 | 2/1978 | Lockbrunner et al. | 339/17 C |
| 4,175,820 | 11/1979 | Wilmes et al. | 339/198 G |
| 4,218,724 | 8/1980 | Kaufman | 361/412 |
| 4,268,108 | 5/1981 | Debaight | 339/198 GA |

FOREIGN PATENT DOCUMENTS

| | | |
|---|---|---|
| 3037783 | 4/1982 | Fed. Rep. of Germany . |
| 3332155 | 3/1984 | Fed. Rep. of Germany ...... 339/198 GA |

Primary Examiner—Gil Weidenfeld
Assistant Examiner—Thomas Kline
Attorney, Agent, or Firm—Herbert L. Lerner; Laurence A. Greenberg

[57] ABSTRACT

An intrinsically safe safety barrier for attachment to a standard profiled supporting bar, includes a housing having a narrow shell-shaped housing part with narrow sides and wide sides, one of the wide sides being open, a circuit board disposed in the housing part, terminals disposed in the housing part and connected to the circuit board, a potential-compensating bar disposed in the housing part and connected to the circuit board, casting resin filling the housing part after the circuit board, terminals and potential-compensating bar have been inserted therein, and a cover attached to the housing part closing the open side thereof before the casting resin hardens, one of the narrow sides of the housing part having resilient formed-out portions thereon for snapping the housing part to the standard profiled supporting bar, and a method of producing the same.

16 Claims, 9 Drawing Figures

ZENER BARRIER

The invention relates to an intrinsically safe barrier or Zener barrier having a housing for receiving the circuit of the safety barrier on a circuit board, means for snapping the safety barrier onto a standard-profile supporting bar, terminals, and a potential-compensating bar.

Zener barriers of this type, which are used in explosion hazard zones, isolate a circuit which is not intrinsically safe from an intrinsically safe circuit.

A Zener barrier of the type mentioned above is disclosed in German Published, Non-Prosecuted Application DE-OS No. 30 37 783. The housing receiving the circuit of the Zener barrier is formed of two housing parts, namely a cup-shaped upper housing part and a lower housing part closing the upper housing part; the two housing parts being connected to one another by filling the interior of the housing with casting resin. The lower housing part receives a threaded bushing, and a potential-compensating bar can be screwed against the outer surface of the lower housing part by means of this threaded bushing.

In addition, a mounting base is fastened to the housing, allowing the Zener barrier to be snapped onto a C-shaped profile bar.

Although the known Zener barrier is of very compact construction, it nevertheless should be noted that it is formed of three parts, namely the upper housing part, the lower housing part and the mounting base. In order to fasten and retain the potential-compensating bar, an additional structural element must also be provided, namely the threaded bushing and the screw interacting therewith.

It is accordingly an object of the invention to provide a Zener barrier and method of production thereof, which overcomes the heretofore-mentioned disadvantages of the heretofore-known devices and method of this general type, which requires as few parts as possible and which can be snapped onto a hat-shaped profile supporting bar as well as onto a C-shaped supporting bar.

With the foregoing and other objects in view there is provided, in accordance with the invention, an intrinsically safe safety barrier on Zener barrier for attachment to a standard profiled supporting bar, comprising a housing having a narrow shell-shaped housing part with narrow sides and wide sides, one of the wide sides being open, a circuit board disposed in the housing part, terminals disposed in the housing part and connected to the circuit board, a potential-compensating bar disposed in the housing part and connected to the circuit board, casting resin filling the housing part after the circuit board, terminals and potential-compensating bar have been inserted therein, and a cover attached to the housing part closing the open side thereof before the casting resin hardens, one of the narrow sides of the housing part having resilient formed-out portions thereon for snapping the housing part to the standard profiled supporting bar.

In order to construct the barrier, there is provided a method for producing an intrinsically safe safety barrier for attachment to a standard profiled supporting bar, including a housing having a narrow shell-shaped housing part with narrow sides and wide sides, one of the wide sides being open, a circuit board, terminals, a potential-compensating bar, casting resin, a cover, and resilient formed-out portions on one of the narrow sides of the housing part, comprising inserting the circuit board, terminals and potential-compensating bar into the housing part through the open wide side, subsequently filling the housing part with casting resin, subsequently closing the open wide side with the cover before the casting resin hardens, and snapping the formed-out portions onto the supporting bar.

The advantage of the invention is essentially that only two parts are required altogether, namely one shell-shaped housing part and the cover which is fastened to the housing part by means of a snap connection and casting resin with which the housing is filled. Furthermore, there is no need for an independent mounting base which has to be provided for retaining the Zener barrier; on the contrary, the individual resilient projections are formed directly on the housing part on a surface of the narrow side thereof, and because of the construction of the projections it becomes possible to snap the Zener barrier either onto a C-shaped profile supporting bar or onto a hat-shaped profile supporting bar.

In accordance with another feature of the invention, the formed-out portions are engageable onto a supporting bar having a hat or C-shaped cross section.

In accordance with a further feature of the invention, the housing part has a lateral surface having a drawn-in portion recessed therein, test connection pins attached to the circuit board and projecting into the drawn-in portion, the pins having a length being long enough to project out of the housing part from the drawn-in portion for testing and short enough to be bent over parallel to the drawn-in portion after testing, and casting resin filling the drawn-in portion with the pins in the bent over position.

In accordance with an added mode of the invention, there is provided a method wherein the housing part has a lateral surface having a drawn-in portion recessed therein, and including test connection pins attached to the circuit board and projecting out of the housing part through the drawn-in portion, which comprises testing a circuit on the circuit board with the pins from outside the housing part, bending over the pins parallel to the drawn-in portion after testing, and filling casting resin into the drawn-in portion.

Whereas, in the Zener diode according to German Published, Non-Prosecuted Application DE-OS No. 30 37 783, the circuit has to be tested before casting, thus presenting the problem of allowing changes and damage to the Zener barrier to be caused as a result of the casting operation itself, in the structure according to the invention, the circuit can be filled with casting resin first and tested after casting, that is to say in the final finished state. This comes about because the test pins project from a specially constructed part of the housing, and after testing, only the test pins still need to be cast in.

In accordance with again another feature of the invention, there are provided staple-shaped projections disposed on the cover, surrounded by the casting resin when the cover is in place, and locked in the casting resin when the casting resin has hardened.

In accordance with again a further mode of the invention, there is provided a method wherein the cover has projections formed thereon, which comprises immersing the projections into the casting resin before hardening when closing the open side with the cover.

In accordance with again an added feature of the invention, the housing is parallelepipedal and has a rectangular contour, the terminals being disposed on the shorter surface of the narrow sides and the formed-out portions being formed on one of the larger surfaces of the narrow sides, i.e. on the bottom of the housing part.

The cover is fastened simply by snapping the cover onto the open side of the filled housing part. This is because according to the invention, staple-shaped projections are disposed on the cover which penetrate the casting resin when the cover is attached to the lateral surface and are thus surrounded by the casting resin. After the casting resin has hardened, the projections are held positively or form-lockingly and force-lockingly by the resin, making it particularly simple to fasten the cover to the housing part. The term "form-locking" refers to an attachment produced by the shape of the parts themselves, whereas "force-locking" refers to an attachment produced by an additional force.

In accordance with again an additional feature of the invention, the formed-out portions are in the form of first, second and third portions, the first and second portions each having a respective nose formed thereon projecting toward each other for engaging behind free legs of a supporting bar with a hat-shaped profile, the third portion being disposed between the first and second portions and having a first groove formed therein for receiving a free leg of a supporting bar with a C-shaped profile, and the second portion being resilient and having a second outer groove formed therein for receiving another free leg of the C-shaped profile supporting bar.

In accordance with yet another feature of the invention, the second formed-out portion has a first segment extended substantially perpendicular to one of the narrow sides or the bottom and a substantially transverse V-shaped second segment adjoining the first segment, the second segment having a V-shaped tip forming the nose thereof and a V-shaped opening forming the first groove.

In accordance with yet a further feature of the invention, there is provided a fourth formed-out portion, the third and fourth formed-out portions each having a respective bearing surface thereon for supporting flat sides of the legs of the hat-shaped profile supporting bar, the first and fourth portions and the second and third portions clamping respective legs of the hat-shaped profile supporting bar.

Because of the special advantageous construction of the projections, it is possible for the housing to be locked firmly on a C-shaped profile supporting bar or on a hat-shaped profile supporting bar. In the structure according to the invention, there is no need at all for additional spring elements or for an additional mounting base which has to be fastened to the housing.

In accordance with yet an added feature of the invention, there are provided extensions disposed on side walls of the housing part, the extensions and cover overlapping the terminals and defining spaces for receiving the terminals between the extensions and the cover. The terminal-receiving space in which the terminals are located is thereby formed by the extension or extensions of the bottom part and the cover and, in each case, by a boundary wall towards the space to be filled with casting resin.

In accordance with yet an additional feature of the invention, the terminals are in the form of upper and lower terminals, and including boundary walls bordering the terminal receiving spaces inwardly toward the casting resin, and two partition walls disposed in each space and extended obliquely outward separating the upper terminals from the lower terminals in each of the spaces and separating the lower terminals from the potential-compensating bar.

In accordance with still another feature of the invention, the terminals have central axes each forming an acute angle with a line perpendicular to the one narrow side of the housing part on which the formed-out portions are formed, the one narrow side being the bottom of the housing part.

Because of these features, the individual terminals are sufficiently isolated from one another in accordance with VDE regulations, so that in every case the permissible minimum air gaps and creep distances or leakage paths are maintained.

In accordance with a concomitant feature of the invention, the housing part has receiving orifices for the terminals formed therein, the receiving orifices being obliquely bordered by the partition walls.

A further advantage of the invention is as follows: in German Published, Non-Prosecuted Application DE-OS No. 30 37 783, the potential-compensating bar is brought up against the housing bottom part from below. In the structure according to the invention, a groove into which the potential-compensating bar can be inserted, is formed in one the side walls of the housing part, in particular in one of the boundary walls between the terminal-receiving space and the space to be filled with casting resin. The potential-compensating bar is then retained by the casting resin and the attached cover. There is no need for an additional screw connection to retain the potential-compensating bar.

Other features which are considered as characteristic for the invention are set forth in the appended claims.

Although the invention is illustrated and described herein as embodied in a Zener barrier and method of producing the same, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which.

Figure 1:
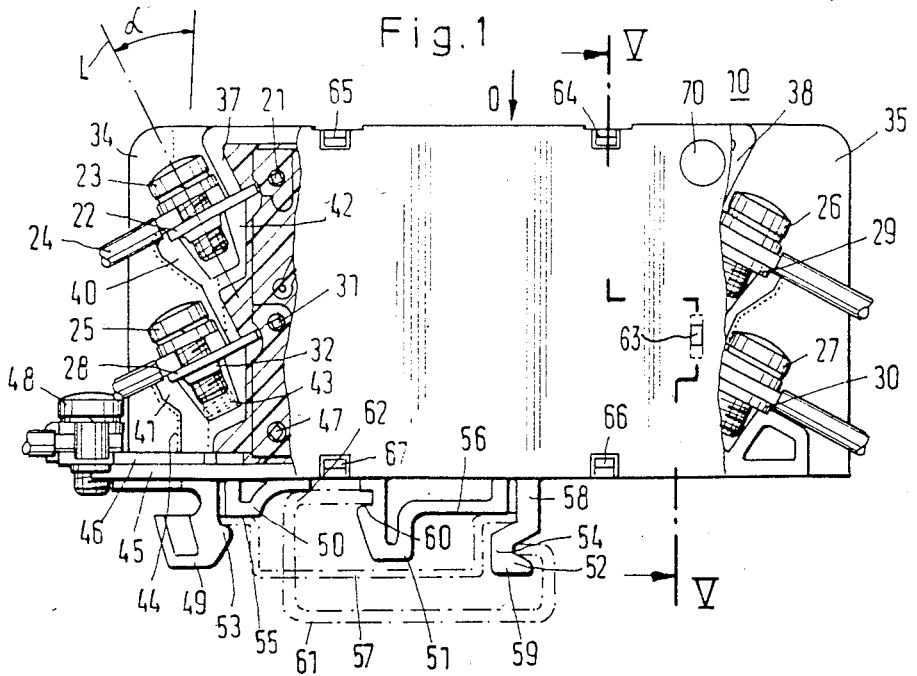
FIG. 1 is a fragmentary, side-elevational view of a Zener barrier with a partially cut away cover.
Figure 2:
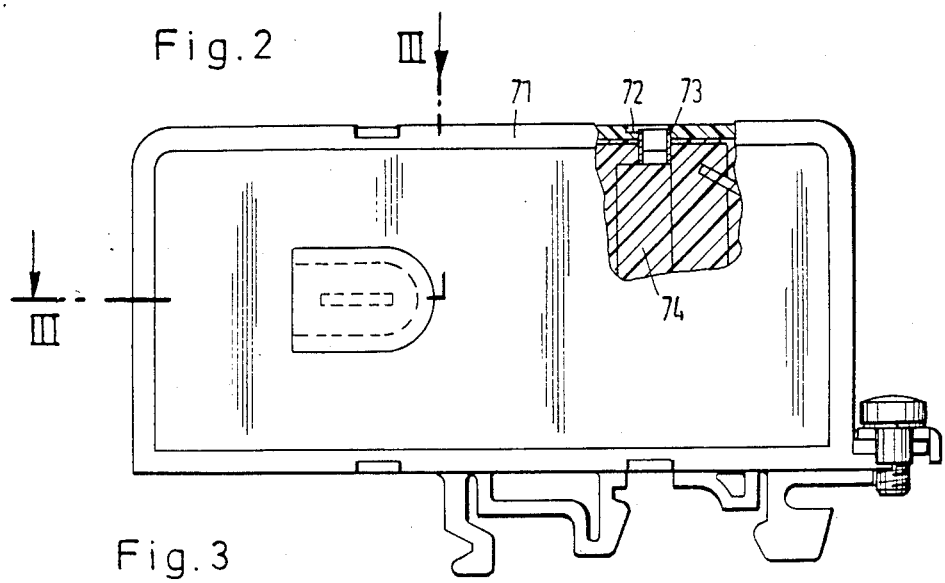
FIG. 2 is a side-elevational view of the opposite side of the Zener barrier shown in FIG. 1, which is also partly broken away.
Figure 5:
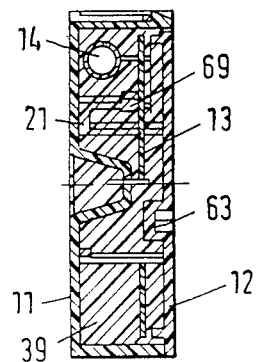
FIG. 5 is a cross-sectional view taken along the line V—V of FIG. 1, in the direction of the arrows.

Referring now to the figures of the drawing in detail and first particularly to FIGS. 1 and 5 thereof, it is seen that the Zener barrier according to the invention is designated as a whole with reference numeral 10, and has a shell-shaped housing part 11 and a cover 12. The shell-shaped housing part 11 has a rectangular shape and a narrow construction. The housing part 11 is open towards one side, as is evident from FIG. 5, and is closed on the open side by means of the cover 12.

The housing part 11 receives a circuit board 13 which carries the individual circuit elements of the circuit for the Zener barrier which is intrinsically safe. Of these components, only a fuse 14 can be seen in FIG. 5.

Figure 3:
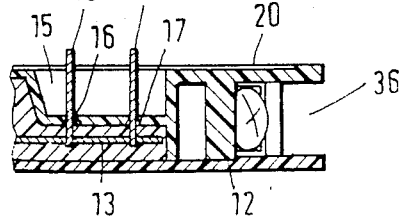
FIG. 3 is a fragmentary cross-sectional view taken along the line III—III in FIG. 2 in the direction of the arrows, before filling with casting resin.

As shown in FIG. 3, the bottom of the housing has a tub-shaped drawn-in portion 15 having two orifices 16 and 17 which are disposed at a distance from one another. Pins 18 and 19 which are fastened to the board 13, are pushed through the orifices after the insertion of the board 13. Specifically, the pins are pushed through the orifice to such an extent that they project beyond the outer surface 20 of the housing part 11. The pins 18 and 19 are test pins, which permit the circuit to be tested electrically.

As shown in FIG. 1, a terminal lug 22 of a terminal screw 23 is provided for connecting a connecting conductor 24 to the circuit. The terminal lug 22 is connected to the circuit board 13 by U-shaped connecting staples 21. The Zener barrier 10 has a total of four terminal screws 23, 25, 26 and 27, having terminal lugs 22, 28, 29 and 30. The terminal lugs 28, 29 and 30 are connected to the circuit board by U-shaped staples 31 similar to the U-shaped staple 21 (only the U-shaped staple 31 of the terminal 25 being visible in the drawing). The terminal lugs 22, 28, 29 and 30 have passages formed therein, of which only the passage 32 of the terminal lug 28 is designated in the drawing. The passages have an internal thread, by means of which the terminals or terminal screws 23, 25, 26 and 27 can be screwed firmly to the terminal lugs.

Figure 4:
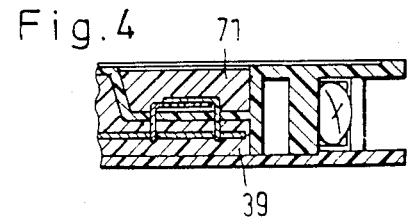
FIG. 4 is a view similar to FIG. 3, after filling with casting resin.

As can be seen from FIG. 1 and very clearly from FIGS. 3 and 4 as well, the lower level or surface having the drawn-in portion 15 has extensions 34 and 35 on the two narrow sides thereof which cover the terminals and limit the terminal-receiving space on this side. The outer contour of the cover 12 matches the contour of the housing part 11 together with the extensions 34 and 35, so that the cover 12 limits the terminal-receiving space on the other side. Towards the inside, that is to say toward the interior of the housing part 11, each terminal-receiving space is bordered by a respective boundary wall 37 and 38 which at the same time forms a partition or sealing wall for casting resin 39 with which the housing is filled.

FIG. 1 shows particular clearly that walls 40 and 41 surround the terminal screws and adjoin the boundary walls. The partition walls together with the boundary walls 37 and 38, thus form receiving spaces 42 and 43 for the terminal screws 23 and 25. This is done in such a way that the angle between the longitudinal axis L of each terminal screw and a line parallel to the longer edge of the narrow side or a line perpendicular to the bottom of the housing part is acute, so that the four terminal screws 23, 25, 26 and 27 can be actuated from above, that is to say as seen from the direction of the arrow). The partition walls serve to ensure that the creep distances or leakage paths, represented by dots and designated by reference numeral 44 in FIG. 1, are sufficiently long.

A potential-compensating bar 46 is inserted in vicinity of the lower edge of the narrow side formed by a bottom closing wall 45. The potential-compensating bar 46 continues inwards in a U-shaped staple 47 corresponding to the U-shaped staple 31. The potential-compensating bar 46 with the U-shaped staple 47 is connected to the circuit board or to the electrical components of the circuit on the circuit board 13. A clamping or terminal screw 48 is attached to the outer end of the potential-compensating bar 46.

First, second, third and fourth projections 49, 52, 51 and 50, respectively, are formed on the outer surface of the bottom wall 45. The first projection 49, which will also be referred to as the first formed-out portion 49, has an inwardly pointing nose 53, corresponding to an inwardly pointing nose 54 pointing towards the nose 53. The fourth formed-out portion 50 has a first bearing 55 located in immediate vicinity of the nose 53, and in the same way the third formed-out portion 51 has a bearing surface 56 located in vicinity of the nose 54. It will be seen that the two noses 53 and 54, together with the bearing surfaces 55 and 56, serve for retaining ends of free legs of a hat-shaped bar 57.

The nose 54 is formed by a region 58 extending perpendicularly to the bottom wall 45 having an adjoining V-shaped region 59 with a tip forming the nose 54 and an open side pointing in a direction extending parallel to the bottom wall.

The third projection 51 has a groove 60 formed therein which acts along with an open V-shaped side of the second formed-out portion 52 to receive the ends of the legs of a C-shaped supporting bar 61. In addition to the bearing surface 55, the fourth formed-out portion 50 has a further bearing surface 62, against which one leg of the C-shaped supporting bar 61 rests.

The first and third formed-out portions 49 and 51 are constructed in such a way as to be relatively rigid, whereas the second formed-out portion 52 is resiliently elastic, so that the Zener barrier or the housing thereof can be snapped firmly on the two supporting bars.

The cover 12 has several projections 63, 64, 65, 66 and 67, as seen in FIG. 1. The cover can be locked firmly on the housing part 11 by means of the projections 64 to 67. Only the projections 63 located towards the right in FIG. 1 can be seen. The two projections 63 are hat or staple-shaped and penetrate into the interior of the casting resin 39, so that the casting resin surrounds the projections completely and thereby retains the cover in a positive or form-locking manner.

The mounting or assembly of the Zener barrier is as follows:

First, the circuit board 13 is inserted into the open wide side of the housing part 11, with the circuit board resting on housing projections on the housing part 11, which are not shown in detail in the drawing, and on widened portions of the staples 21, 31 and 47. To ensure further support, the staples 21, 31 rest on the inner surface of the side wall, as can be clearly seen in FIG. 5 with reference to the staple 21. At the same time, the pins 18 and 19 connected to the circuit board pass through the two orifices 16 and 17. Subsequently, the housing part 11 together with the inserted circuit board is filled with casting resin and the cover is attached before the casting resin has hardened. It is, of course, also possible to provide a hole 70 in the cover, through which the casting resin can be poured in after the cover has been snapped on at the projections 64 to 67. After the casting resin has hardened, the circuit of the Zener barrier is tested through the two connecting pins 18 and 19, the pins 18 and 19 are bent over, as is evident from FIG. 4, simultaneously ensuring that the two pins 18 and 19 are electrically conductively connected to one another, and the drawn-in portion 15 is then filled with casting resin 71'. Thus, the Zener barrier 10 is tested after it has been filled and finished.

It should also be added that an end wall 71 is disposed opposite the bottom surface or bottom wall 45, having an orifice 72 formed therein and adjoined by or surrounding a guide ring 73 which rests on an adjustable switching element 74. The guide ring 73 serves for sealing off that part of the adjustable switching element which has to be actuated from outside the housing after the Zener barrier has been assembled, so that the adjusting device remains accessible from outside.

Figure 6:
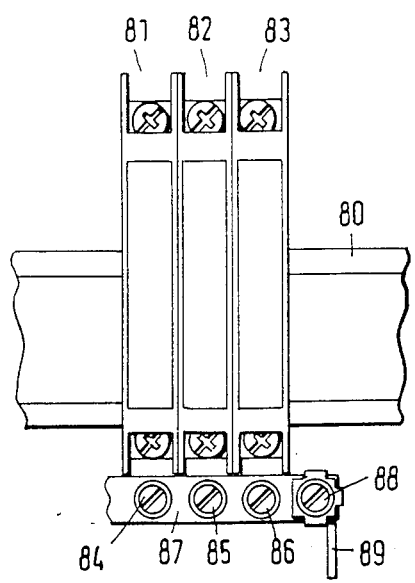
FIGS. 6 to 8 are similar fragmentary, elevational views of three Zener barriers located adjacent one another, with different connections to the potential-compensating bar.
Figure 7:
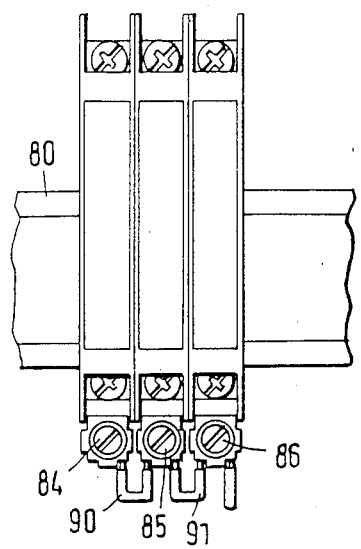
Figure 8:
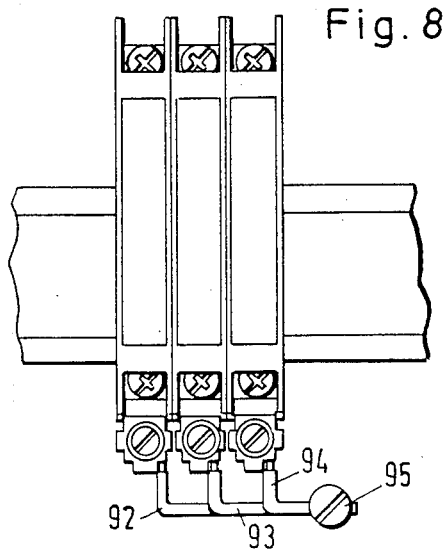

FIGS. 6 to 8 show different methods of interconnecting the potential bar of several Zener barriers. Three Zener barriers 81, 82 and 83 which are snapped on adjacent one another can be seen to be disposed on a hat-shaped supporting bar 80 corresponding to the hat-shaped supporting bar 57 of FIG. 1. Terminals 84 to 86 are coupled by means of a bus bar 87. A terminal 88 for a connecting conductor 89 is formed or fastened on one end of the bus bar 87.

Figure 9:
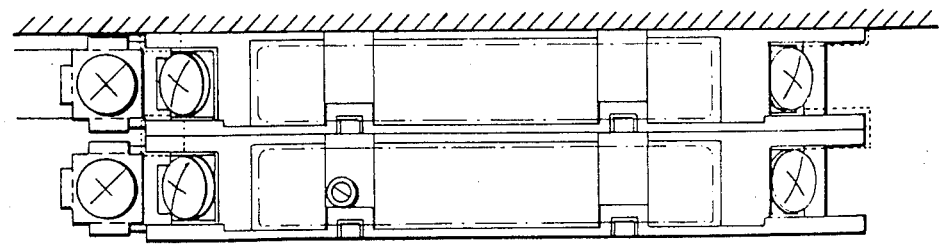
FIG. 9 is a partially cross-sectional view of two Zener barriers fastened to a wall.

In the structure shown in FIG. 7, the individual terminals 84 to 86 are connected to one another by means of conductor connection pieces 90 and 91 bent in the shaped of a U, whereas in the structure shown in FIG. 8, the individual terminals 84 to 86 are connected to connecting conductors 92 to 94 which are connected to one another by means of a connecting terminal 95. A further connecting or ground conductor can then be connected to the connecting terminal 95. FIG. 9 shows a fastening of two Zener barriers to a wall seen at the top of the figure.

We claim:

1. Intrinsically safe Zener barrier for attachment to a standard profiled supporting bar, comprising a housing having a housing part with an outer surface, narrow sides and wide sides, one of said wide sides having an opening formed therein, a circuit board carrying a circuit for the Zener barrier and being disposed in said housing part, terminals disposed in said housing part and connected to said circuit board, a potential-compensating bar disposed in said housing part and connected to said circuit board, casting resin filling said housing part after said circuit board, terminals and potential-compensating bar have been inserted therein, a cover plate having a surface with projections formed therein, said cover plate being attached to said housing part with said surface thereof closing said opening formed in said side thereof after filling said housing part with said casting resin but before said casting resin hardens and with said projections immersed in and surrounded by said casting resin and locked in said casting resin after hardening, said outer surface of one of said wide sides of said housing part having a drawn-in portion recessed therein, test connection pins attached to said circuit board and projecting into said drawn-in portion, said test connection pins being long enough to protrude out of said housing, said test connection pins being bent into a mutually parallel position in said drawn-in portion, and additional casting resin filling said drawn-in portion and covering said bent test connection pins, whereby said circuit can be tested with said test connection pins prior to bending said test connection pins and filling said drawn-in portion with said additional casting resin, and means for snapping said housing to the standard profiled supporting bar.

2. Intrinsically safe safety barrier for attachment to a standard profiled supporting bar, comprising a housing having a housing part with narrow sides and wide sides, one of said wide sides having an opening formed therein, a circuit board disposed in said housing part, terminals disposed in said housing part and connected to said circuit board, a potential-compensating bar disposed in said housing part and connected to said circuit board, casting resin filling said housing part after said circuit board, terminals and potential-compensating bar have been inserted therein, a cover attached to said housing part closing said opening formed in said thereof before said casting resin hardens, one of narrow sides of said housing part having resilient formed-out portions thereon for snapping said housing part to the standard profiled supporting bar, said housing part having a lateral surface having a drawn-in portion recessed therein, test connection pins attached to said circuit board and projecting through said drawn-in portion, said pins having a length being long enough to project out of said housing part from said drawn-in portion for testing and short enough to be bent over parallel to said drawn-in portion after testing, and additional casting resin filling said drawn-in portion with said pins in said bent over position, whereby said circuit can be tested with said test connection pins prior to bending said test connection pins and filling said drawn-in portion with said additional casting resin.

3. Barrier according to claim 1, wherein said projections disposed on said cover plate have a hat-shaped profile.

4. Barrier according to claim 1, wherein said housing has a rectangular contour, and said narrow sides of said housing parts have shorter and longer surfaces, said terminals being disposed on the shorter surfaces of said narrow sides and said snapping means are formed on one of the longer surfaces of said narrow sides.

5. Barrier according to claim 1, wherein said housing has a rectangular contour, and said narrow sides of said housing parts have shorter and longer surfaces, said terminals being disposed on the shorter surfaces of said narrow sides and said snapping means are formed on the bottom of said housing part.

6. Barrier according to claim 1, wherein said snapping means are in the form of first, second and third resilient formed-out portions disposed on one of said narrow sides of said housing part, said first and second portions each having a respective nose formed thereon projecting toward each other for engaging behind free legs of a supporting bar with a hat-shaped profile, said third portion being disposed between said first and said second portions and having a first groove formed therein for receiving a free leg of a supporting bar with a C-shaped profile, and said second portion being resilient and having a second outer groove formed therein for receiving another free leg of the C-shaped profile supporting bar.

7. Barrier according to claim 4, wherein said snapping means are in the form of first, second and third resilient formed-out portions disposed on one of said narrow sides of said housing part, said first and second portions each having a respective nose formed thereon projecting toward each other for engaging behind free legs of a supporting bar with a hat-shaped profile, said third portion being disposed between said first and said second portions and having a first groove formed therein for receiving a free leg of a supporting bar with a C-shaped profile, and said second portion being resilient and having a second outer groove formed therein for receiving another free leg of the C-shaped profile supporting bar.

8. Barrier according to claim 5, wherein said snapping means are in the form of first, second and third resilient formed-out portions disposed on one of said narrow sides of said housing part, said first and second portions each having a respective nose formed thereon projecting toward each other for engaging behind free legs of a supporting bar with a hat-shaped profile, said third portion being disposed between said first and second portions and having a first groove formed therein for receiving a free leg of a supporting bar with a C-shaped profile, and said second portion being resilient and having a second outer groove formed therein for receiving another free leg of the C-shaped profile supporting bar.

9. Barrier according to claim 7, wherein said second formed-out portion has a first segment extended substantially perpendicular to one of said narrow sides and a substantially transverse V-shaped second segment adjoining said first segment, said second segment having a V-shaped tip forming said nose thereof and V-shaped opening forming said first groove.

10. Barrier according to claim 8, wherein said second formed-out portion has a first segment extended substantially perpendicular to the bottom and a substantially transverse V-shaped second segment adjoining said first segment, said second segment having a V-shaped tip forming said nose thereof and a V-shaped opening forming said first groove.

11. Barrier according to claim 6, including a fourth formed-out portion, said third and fourth formed-out portions each having a respective bearing surface formed thereon for supporting flat sides of the legs of the hat-shaped profile supporting bar, said first and fourth portions and said second and third portions clamping respective legs of the hat-shaped profile supporting bar.

12. Barrier according to claim 1, including extensions integral with one of said wide side walls of said housing part, said extensions and cover overlapping said terminals and defining spaces for receiving said terminals between said extensions and said cover.

13. Barrier according to claim 12, including boundary walls each bordering a respective one of said terminal receiving spaces.

14. Barrier according to claim 13, wherein said terminals include upper and lower terminals, and including two partition walls disposed in each space and extended obliquely outward separating said upper terminals from said lower terminals in each of said spaces and separating said lower terminals from said potential-compensating bar.

15. Barrier according to claim 14, wherein one of said sides of said housing part is a bottom wall, and said upper and lower terminals have central axes each forming an acute angle with a line perpendicular to said bottom wall.

16. Barrier according to claim 15, wherein said terminals have clamping screws, and said housing part has receiving orifices for said clamping screws formed therein, said receiving orifices being bordered by said partition walls.

* * * * *